(12) United States Patent
Pelly

(10) Patent No.: US 6,429,639 B1
(45) Date of Patent: *Aug. 6, 2002

(54) COMBINED FILTER INDUCTOR AND HALL CURRENT SENSOR

(75) Inventor: Brian R. Pelly, Palos Verdes Estates, CA (US)

(73) Assignee: International Rectifier Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/010,464

(22) Filed: Jan. 21, 1998

Related U.S. Application Data

(60) Provisional application No. 60/035,968, filed on Jan. 21, 1997.

(51) Int. Cl.⁷ .................................................. G01R 33/00
(52) U.S. Cl. .................................. 324/117 H; 324/127
(58) Field of Search ........................ 324/117 R, 117 H, 324/99 D, 99 R, 127, 251, 142, 201, 103 R; 327/511; 338/32 H, 32 R

(56) References Cited

U.S. PATENT DOCUMENTS

| | | | | |
|---|---|---|---|---|
| 3,343,084 A | * | 9/1967 | Gambale et al. | 324/103 R |
| 3,614,618 A | * | 10/1971 | Schrader | 324/201 |
| 3,649,912 A | * | 3/1972 | Nakamura | 324/127 |
| 4,160,950 A | * | 7/1979 | Houldsworth | 324/107 |
| 4,823,075 A | * | 4/1989 | Alley | 324/117 H |
| 4,901,008 A | * | 2/1990 | Quastel et al. | 324/117 H |
| 5,414,349 A | * | 5/1995 | Kobayashi | 324/142 |
| 5,461,308 A | * | 10/1995 | Jin et al. | 324/117 R |
| 6,005,383 A | | 12/1999 | Savary et al. | |
| 6,040,688 A | | 3/2000 | Strubin | |
| 6,137,284 A | * | 10/2000 | Arai et al. | 324/117 H |

OTHER PUBLICATIONS

U.S.P.T.O. database list of patents issued for similar inventions as of Mar. 4, 2001.

* cited by examiner

Primary Examiner—Michael J. Sherry
Assistant Examiner—Minh N. Tang
(74) Attorney, Agent, or Firm—Ostrolenk, Faber, Gerb & Soffen, LLP

(57) ABSTRACT

A combined filter inductor and Hall current sensor for a double inverter motor drive is formed on a unitary magnetic core. The magnetic core has a suitable winding and air gap to comprise an inductor. The Hall effect sensor is situated in the airgap to detect a Hall effect voltage created by the magnetic flux in the air gap.

2 Claims, 2 Drawing Sheets

H.S - HALL CURRENT SENSOR

COMBINED FILTER INDUCTOR AND HALL CURRENT SENSOR

CROSS REFERENCE TO RELATED APPLICATIONS

This application is based on and claims priority to U.S. Provisional Patent Application No. 60/035,968, filed on Jan. 21 1997, entitled COMBINED FILTER INDUCTOR AND HALL CURRENT SENSOR.

FIELD OF THE INVENTION

This invention relates to current sensing devices, and more specifically relates to a Hall sensor mounted in the airgap of the magnetic core of an inductor which has some other function in an electrical circuit.

BACKGROUND OF THE INVENTION

Many electrical circuits require one or more inductor devices and also require one or more current sensors which monitor the current in the inductors. Such inductors are commonly inductors consisting of a magnetic core having a winding thereon. Such current sensors commonly consist of a magnetic core having an airgap in which a Hall-effect element is placed. These sensors must be able to deliver an isolated signal that represents the a-c line input current, including any d-c component. The current to be sensed is carried by a winding on the core, which winding may be either a single turn or a multiple turn winding.

Such prior art structures therefore, require two magnetic cores, one for the inductor and another for the Hall-effect current monitor. These two cores and their windings have an accordingly increased mass and volume of the circuit in which they are disposed.

BRIEF SUMMARY OF THE INVENTION

In accordance with the invention, the magnetic cores of the circuit inductor and of the Hall sensor are combined, and the Hall-sensor crystal is inserted into the airgap in the inductor core. Consequently, the mass and volume of the combined circuit inductor and Hall sensor is substantially reduced.

DETAILED DESCRIPTION OF THE INVENTION

Figure 1:
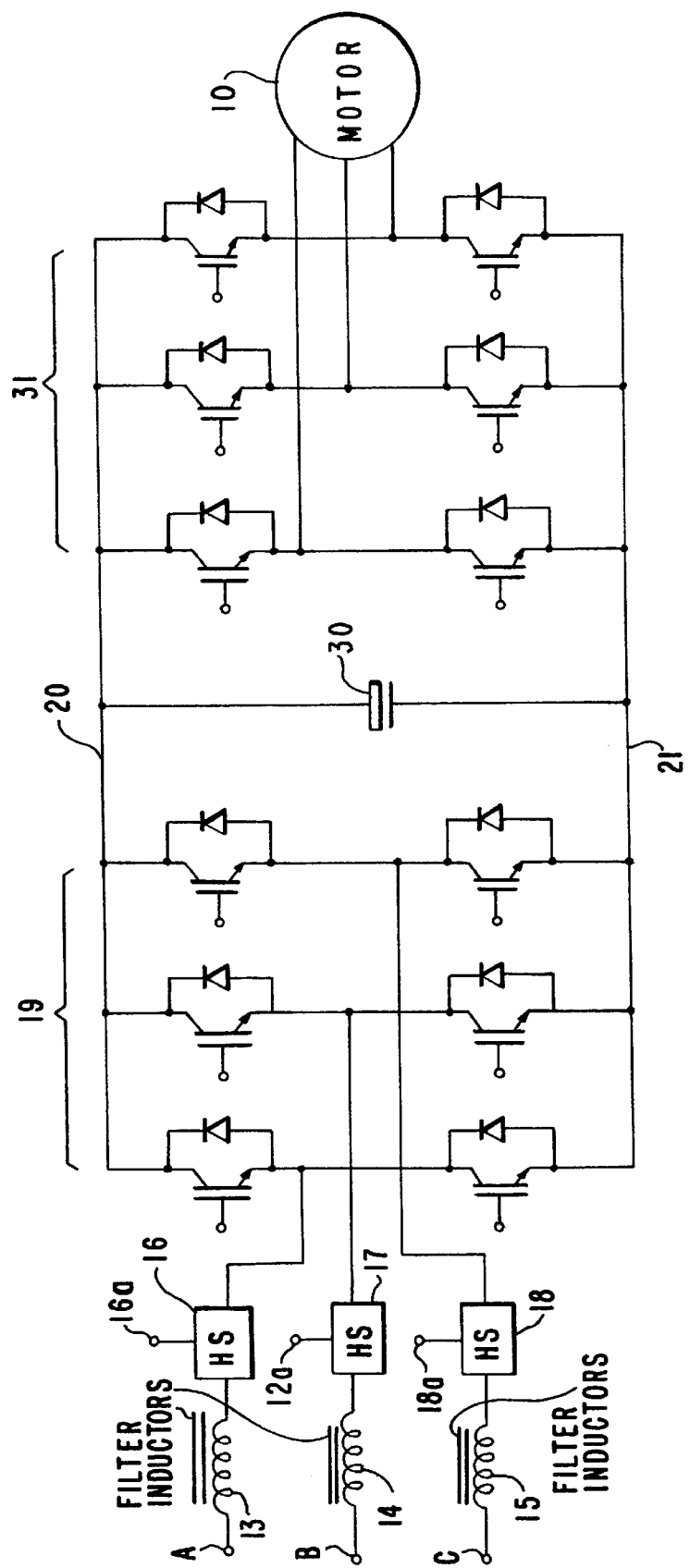
FIG. 1 is a circuit diagram of a prior art double inverter motor drive with separate filter inductors and Hall sensors.

FIG. 1 shows a prior art double inverter circuit for the drive of a motor 10. A three-phase input a-c source is connected to input a-c terminals A, B and C which are connected in series with conventional respective iron core filter inductors 13, 14 and 15 respectively. Each phase also contains a respective conventional Hall sensor 16, 17 and 18. The three phases are then connected to the a-c input terminals of rectifier 19 which produces a controlled d-c output voltage on positive and negative rails 20 and 21, respectively.

Rectifier 19 consists of six IGBTs connected and driven in conventional fashion. Each IGBT is provided with a conventional parallel connected fast recovery diode. The Hall sensors 16, 17 and 18 are provided to measure the current flow in each leg of bridge 19 and to produce related output signals at terminals 16a, 17a and 18a showing the a-c current and any d-c components.

A filter capacitor 30 is connected across d-c output rails 20 and 21 and acts as an input to inverter section 31. Inverter 31 is conventional and delivers a variable frequency output to motor 10 to control its operation. Note that any desired control scheme can be used to deliver control signals to the gate terminals of the IGBTs in sections 19 and 31.

Each of filter inductors 13, 14 and 15 are large, heavy devices consisting of a transformer iron core and a suitable winding thereon. Each of Hall sensors 16, 17 and 18 also employs an iron core with a small airgap containing the Hall sensor.

Figure 2:
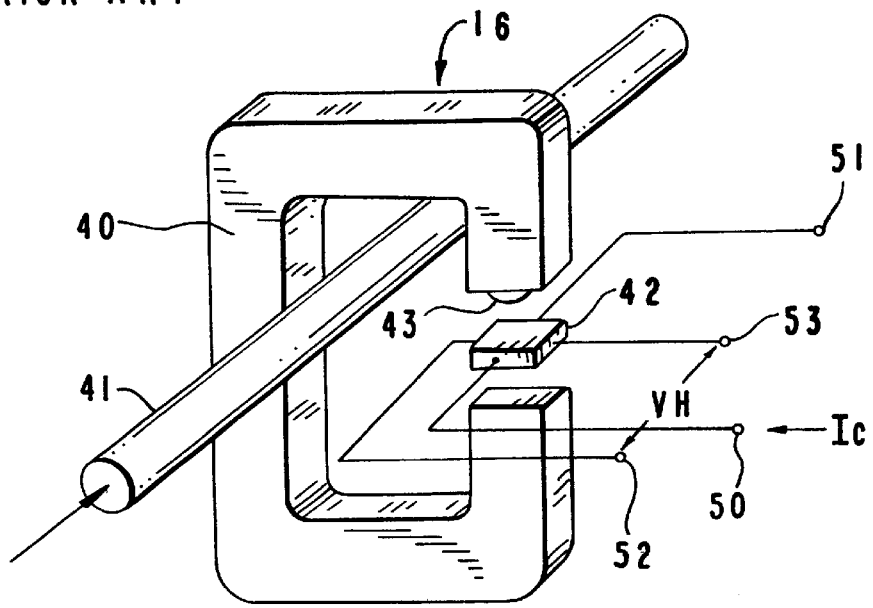
FIG. 2 is a diagram of the prior art Hall current sensor in FIG. 1.

Thus, Hall-effect element 16 is shown in more detail in FIG. 2 as consisting of a magnetic core 40 having a single turn winding 41 which carries the current to be measured. A Hall-effect device or sensor 42 is placed in airgap 43 of core 40 so that a magnetic flux proportional to the current in winding 41 to be measured crosses the element 42. A control current $I_c$ is then injected between terminals 50 and 51. A Hall voltage $V_H$ will then be produced orthogonally to the current $I_c$ at output terminals 52 and 53. The voltage $V_H$ is proportional to the current in winding 41.

Figure 3:
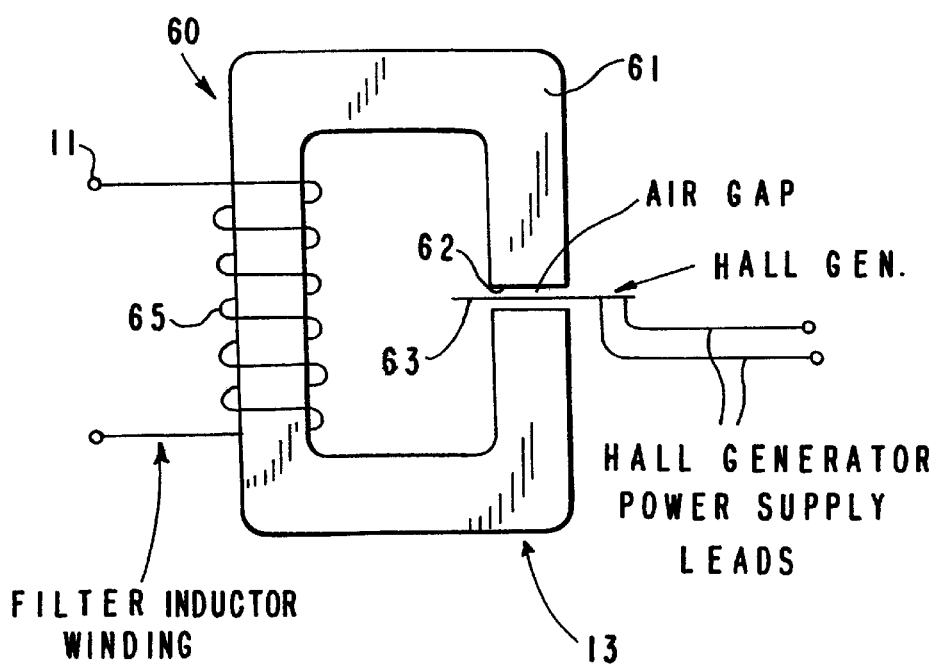
FIG. 3 is a diagram of a combined filter inductor and Hall sensor in accordance with the invention.

In accordance with the present invention, and as shown in FIG. 3 for the phase of FIG. 1 containing inductor 13 and Hall sensor 16, the two magnetic components are combined into a single component 60 which contains a magnetic core 61 with an airgap 62. A standard Hall generator 63 is supported within gap 62 and has the necessary input and output leads shown in FIG. 2. The filter inductor winding 65 is wound on core 60.

In the device 60 of FIG. 3, the functions of filter inductance and current sensing are carried out with a single core 61. Therefore, the unitary device will be lighter than and occupy less space than the prior art separate elements 13 and 16. The C-core is typically the shape used, but other shapes and configurations are possible. Clearly, a structure such as that of FIG. 3 will be used for each phase of FIG. 1.

What is claimed is:

1. An inverter circuit for driving a load, the inverter circuit comprising a three-phase AC input circuit including a three-phase rectifier circuit which produces a controlled DC output voltage on positive and negative rails, respectively, and a rectifier section that is coupled to the positive and negative rails and which produces a variable frequency output to the load;

a respective unitary inductive device connected to a respective terminal of each phase of said three-phase rectifier circuit and each said respective unitary inductive device comprising a combined filter inductor and a Hall effect sensor, each, said respective unitary inductive device comprising:
a magnetic core having an airgap disposed therein and assisting filtering and sensing of an inductor current;
the filter inductor having at least two windings wound on said magnetic core, said inductor current flowing therethrough;
said filter inductor being structured and arranged to filter a current within said filter inductor;

the Hall effect sensor situated within said airgap so that a magnetic flux through said airgap passes through said Hall effect sensor;

a control current source connected to said Hall effect sensor to apply a control current through said Hall effect sensor which is orthogonal to said magnetic flux in said airgap; and voltage output terminals attached to said Hall effect sensor to output a Hall effect voltage which is proportional to said magnetic flux in said airgap.

2. The inverter circuit as in claim 1, wherein the magnetic core is an iron core.

* * * * *